(12) United States Patent
Durstock et al.

(10) Patent No.: US 9,570,240 B1
(45) Date of Patent: Feb. 14, 2017

(54) CONTROLLED CRYSTALLIZATION TO GROW LARGE GRAIN ORGANOMETAL HALIDE PEROVSKITE THIN FILM

(71) Applicant: The United States of America, as represented by the Secretary of the Air Force, Washington, DC (US)

(72) Inventors: Michael F Durstock, West Chester, OH (US); Santanu Bag, Fairborn, OH (US)

(73) Assignee: The United States of America represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/228,112

(22) Filed: Aug. 4, 2016

(51) Int. Cl.
*H01L 51/00* (2006.01)
*H01G 9/20* (2006.01)
*H01L 51/42* (2006.01)

(52) U.S. Cl.
CPC ........ *H01G 9/2013* (2013.01); *H01L 51/0003* (2013.01); *H01L 51/0028* (2013.01); *H01L 51/0036* (2013.01); *H01L 51/0037* (2013.01); *H01L 51/0046* (2013.01); *H01L 51/0047* (2013.01); *H01L 51/0077* (2013.01); *H01L 51/0096* (2013.01); *H01L 51/4213* (2013.01); *H01L 51/4293* (2013.01)

(58) Field of Classification Search
None
See application file for complete search history.

(56) References Cited

U.S. PATENT DOCUMENTS

| | | | |
|---|---|---|---|
| 8,178,221 B2 | 5/2012 | Goyal | |
| 8,715,839 B2 | 5/2014 | de Rochemont | |
| 2016/0049585 A1* | 2/2016 | Lin | H01L 51/005 438/82 |
| 2016/0308154 A1* | 10/2016 | Irwin | H01L 51/0003 |
| 2016/0329159 A1* | 11/2016 | Chaudhari | H01G 9/2013 |
| 2016/0343965 A1* | 11/2016 | Marks | H01L 51/4213 |

OTHER PUBLICATIONS

Nai et al., "Efficient Electrocatalytic Water Oxidation by Using Amorphous Ni-Co Double Hydroxides Nanocages," Adv. Energy Mater., DOI: 10.1002/aenm.201401880 (2015).
Ning et al., "Quantum dot in perovskite solids," Nature 523, 324-328 (Jul. 16, 2015).
Ding et al., "Optical and Electrical Properties of CH3NH3PHI3 Perovskite Thin Films Transformed from PbO-PbI2 Hybrid Films," Acta Physico-Chimica Sinica, vol. 31, No. 3, pp. 576-582 (Mar. 15, 2015).

* cited by examiner

*Primary Examiner* — Alexander Ghyka
(74) *Attorney, Agent, or Firm* — AFMCLO/JAZ; Charles Figer, Jr.

(57) ABSTRACT

A method of forming perovskite thin films with micron-sized perovskite grains is provided. A layer of $PbX_2$ in a solution containing a metal ion additive is applied to a structure. The structure with the $PbX_2$ layer is annealed a first time. The $PbX_2$ is exposed to $CH_3NH_3X$ in a solvent. The structure with the exposed $PbX_2$ layer is annealed a second time resulting in a $CH_3NH_3PbX_3$ layer. X is selected from a group consisting of Cl, Br, I, CN, and SCN.

23 Claims, 11 Drawing Sheets

CONTROLLED CRYSTALLIZATION TO GROW LARGE GRAIN ORGANOMETAL HALIDE PEROVSKITE THIN FILM

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to growing perovskite film layers.

Description of the Related Art

Among different alternative energy technologies, thin-film photovoltaics (PV) hold great promise to provide cleaner and sustainable energy at a cost competitive with fossil fuels provided the associated material and fabrication costs for manufacturing such photovoltaic modules get substantially lower at reasonable efficiency levels. Current state-of-the-art commercial photovoltaic devices are produced in non-continuous batch-to-batch processes at high temperatures using high-vacuum deposition methods. The associated capital cost for such processes is enormous. The foundation of the next generation PV technology is believed to be based on solution-processing of device components. Solution processed methylammonium lead tri-halide ($CH_3NH_3PbX_3$, X=Cl, Br, I) perovskite as a photoactive starting material is of particular interest due to its earth abundant nature, low temperature processability, favorable electronic properties, high photovoltaic power conversion efficiencies (PCEs), and low-cost roll-to-roll (R2R) coating compatibility on large area flexible substrates. However, the utility of this material system towards successful technology deployment will only be possible through the combined efforts of improved materials engineering, fine control of the photoactive layer morphology and integration into sophisticated device architectures.

Contemporary perovskite solar cells are based on two main device architectures; namely a mesostructured configuration and a thin-film planar heterojunction structure. In both cases, high PCEs have been achieved for small area devices. The construction of complex mesostructured device architectures require high-temperature sintering (>450° C.) for the formation of electron-transporting metal-oxide layers, such as mesoporous or compact $TiO_2$, which limits their applicability on flexible roll-to-roll compatible plastic substrates. Thin-film planar heterojunction (PHJ) structures, with no mesoporous $TiO_2$, are advantageous for high-throughput manufacturing in terms of their simple device configuration and low temperature processing. Several planar-heterojunction structures (p-i-n and n-i-p), which avoid the mesoporous scaffold and have different combinations of charge transporting interlayers, have been investigated by numerous research groups and the PCEs from these systems are on par with those utilizing a mesostructured configuration. Planar heterojunction p-i-n structures consisting of poly(3,4-ethylenedioxythiophene):polystyrene sulfonate (PEDOT:PSS) as a hole-transport layer (p-type) and phenyl-C61-butyric acid methyl ester (PCBM) as an electron-transport layer (n-type) are promising due to their low-temperature solution processability, excellent bendability and tunable conductivity.

A typical perovskite based p-i-n planar heterojunction solar cell device fabrication starts using glass as a substrate, indium-doped tin oxide (ITO) as a transparent conductive oxide front contact and PEDOT:PSS as a hole-transport layer. Then the perovskite active layer is deposited on top of PEDOT:PSS, followed by a thin layer of PCBM as an electron acceptor and finally an aluminum (Al) metal layer as a cathode. At present, one of the main issues encountered in this device fabrication process is the fine control of film morphology during the deposition and crystallization of the perovskite layer. To avoid shunting in such planar structures, a homogeneous and pinhole-free perovskite layer is crucial. Besides surface coverage, the optimization of several other important material parameters, such as material crystallinity and grain structure, could lead to improved electronic properties of the perovskite films and thereby superior device performance.

Generally, the low temperature, solution processed, photovoltaic thin-film materials contain randomly oriented small grains with significant amount of grain boundaries. The presence of high density grain boundary regions creates traps and recombination centers for the charge carriers, and adversely affects the overall carrier transport properties. Accordingly, there is a need in the art for processes suitable for optimizing photoactive layer film morphology with large grains, while simultaneously minimizing the grain boundary regions, for reduced recombination of charge carriers.

SUMMARY OF THE INVENTION

Thin-film p-i-n type planar heterojunction perovskite solar cells have the advantage of full low temperature solution processability and can, therefore, be adopted in roll-to-roll production and flexible devices. One of the main challenges with these devices, however, is the ability to finely control the film morphology during the deposition and crystallization of the perovskite layer. Processes suitable for optimization of the perovskite layer film morphology with large grains are highly desirable for reduced recombination of charge carriers. Uniform thin films with micron size perovskite grains can be made through the use of a controlled amount of metal ions in the precursor solution consistent with embodiments of the invention. For example, large micrometer-size $CH_3NH_3PbI_3$ perovskite grains may be formed during low-temperature thin-film growth by adding sodium ions to the $PbI_2$ precursor solution in a two-step interdiffusion process. By adjusting additive concentration, film morphologies were optimized and the fabricated p-i-n planar perovskite-PCBM solar cells showed improved power conversion efficiencies (an average of 3-4% absolute efficiency enhancement) compared to the nonsodium based devices. Overall, the additive enhanced grain growth process helped to reach a high 14.2% solar cell device efficiency with low hysteresis. This method of grain growth is quite general and provides a facile way to fabricate large-grained $CH_3NH_3PbX_3$ on any arbitrary surface by an all solution-processed route.

The embodiments of the invention provide a method of forming perovskite thin films with micron-sized perovskite grains. A layer of $PbX_2$ in a solution containing a metal ion additive is applied to a structure. The structure with the $PbX_2$ layer is annealed a first time. The $PbX_2$ is exposed to $CH_3NH_3X$ in a solvent. The structure with the exposed $PbX_2$ layer is annealed a second time resulting in a $CH_3NH_3PbX_3$ layer. X is selected from a group consisting of Cl, Br, I, CN, and SCN.

These embodiments may be utilized to create a multi-layered perovskite structure. For example, a PEDOT:PSS coating may be applied to an ITO glass substrate and then subsequently dried. A layer of PbX$_2$ in a solution containing a metal ion additive is applied to the PEDOT:PSS coating. The PEDOT:PSS coated ITO glass substrate with the PbX$_2$ layer is annealed a first time. The PbX$_2$ is exposed to CH$_3$NH$_3$X in a solvent. The PEDOT:PSS coated ITO glass substrate with the exposed PbX$_2$ layer is annealed a second time resulting in a CH$_3$NH$_3$PbX$_3$ layer. As above, X is selected from a group consisting of Cl, Br, I, CN, and SCN. In some applications of the embodiments of the invention the layered structure may further include depositing a layer of PC$_{71}$BM atop the resulting CH$_3$NH$_3$Pb$_3$ layer, and performing thermal evaporation of C$_{60}$ and Al onto the PC$_{71}$BM layer.

In the embodiments of the invention, the metal ion additive is selected from a group of metal ions: Li+, K+, Na+, Rb+, Cs+, Ag+, Be2+, Mg2+, Ca2+, Sr2+, Ba2+, Zn2+, Cd2+, Hg2+, Fe2+/Fe3+, Ru2+/Ru3+, Os4+, Mn2+, Pt2+, Pd2+, Sb3+, Ga3+, In3+, Al3+, Bi3+, La3+, Ce3+, Pr3+, Nd3+, Pm3+, Sm3+, Eu3+, Gd3+, Tb3+, Dy3+, Ho3+, Er3+, Tm3+, Yb3+, Lu3+, Sn4+, Ti4+, Ge4+, Zr4+, V4+, Nb5+, Ta5+, Zr4+, Hf4+, Sc3+, Y2+/Y3+, Tc4+/Tc7+, Cr3+/Cr2+/Cr6+, Mo4+/Mo6+, W4+/W6+, Co2+/Co3+, Rh3+, Ir3+/Ir2+/Ir4+, Ni2+, Cu1+/Cu2+, Au1+/Au3+, and combinations thereof. Oxidation states of a given metal ion additive may vary from 0 to 6. Additionally, a concentration of the metal ion additive in the embodiments of the invention may range between about 1 mol % and about 6 mol %.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Organic-inorganic hybrid methylammonium lead trihalide-based (CH$_3$NH$_3$PbX$_3$; X=Cl, Br, I) perovskite materials have been the focus of immense research in recent years in the quest for next-generation, efficient photovoltaic technology. This class of materials possess several unique features for photovoltaic applications, such as intense light absorption across the visible spectrum, long carrier diffusion lengths, tunable band gap, excellent carrier transport, and insensitivity to defect formation. Their low-temperature solution processability, earth-abundant nature, and chemical tunability could be advantageous for low-cost roll-to-roll (R2R) coatings on large-area flexible substrates. Rapid breakthroughs resulting in certified power conversion efficiencies (PCE) over 20% from these organolead halide perovskites in a short time has made them relevant to and competitive with commercialized c-Si, thin film CIGS, and CdTe photovoltaic technologies. Contemporary perovskite solar cells are based on two main device architectures; namely a mesostructured configuration and a thin-film planar heterojunction structure. In both cases, high PCEs have been achieved for small area devices. The construction of complex mesostructured device architectures require high-temperature sintering (>450° C.) for the formation of electron-transporting metal-oxide layers, such as mesoporous or compact $TiO_2$, which limits their applicability on flexible roll-to-roll compatible plastic substrates. Thin-film planar heterojunction (PHD structures, with no mesoporous $TiO_2$, are advantageous for high-throughput manufacturing in terms of their simple device configuration and low temperature processing. Several planar-heterojunction structures (p-i-n and n-i-p), which avoid the mesoporous scaffold and have different combinations of charge transporting interlayers, have been investigated by numerous research groups and the PCEs from these systems are on par with those utilizing a mesostructured configuration. Planar heterojunction p-i-n structures consisting of poly(3,4-thylenedioxythiophene):polystyrenesulfonate (PEDOT:PSS) as a hole-transport layer (p-type) and phenyl-C61-butyric acid methyl ester (PCBM) as an electron-transport layer (n-type) are promising because of their low-temperature solution processability, excellent bendability, and tunable conductivity.

A typical perovskite-based p-i-n planar heterojunction solar cell device fabrication starts using glass as a substrate, indium-doped tin oxide (ITO) as a transparent conductive oxide front contact and PEDOT:PSS as a hole-transport layer. The perovskite active layer is then deposited on top of PEDOT:PSS, followed by a thin layer of PCBM as an electron acceptor, and finally an aluminum (Al) metal layer as a cathode. Currently, one of the main issues encountered in this device fabrication process is the fine control of film morphology during a deposition and crystallization of the perovskite layer. To avoid shunting in such planar structures, a homogeneous and pinhole-free perovskite layer is crucial. Besides surface coverage, optimization of several other important material parameters, such as material crystallinity and grain structure, may lead to improved electronic properties of the perovskite films and thereby superior device performance. Because grain boundaries may act as recombination centers for photogenerated charge carriers and reduce device performance, it is anticipated that large grains, on the order of the film thickness, could facilitate charge transport by reducing the number of defects and trap states.

Embodiments of the invention address this need in the art by providing a methodology to create uniform thin films with micron size perovskite grains through the use of a controlled amount of an additive in the precursor solution. Large micrometer-size $CH_3NH_3PbI_3$ perovskite grains, for example, may be formed during low-temperature thin-film growth by adding the additive ions to the $PbI_2$ precursor solution in a two-step interdiffusion process. By adjusting additive concentration, film morphologies were optimized and the fabricated p-i-n planar perovskite-PCBM solar cells showed improved power conversion efficiencies (an average of 3-4% absolute efficiency enhancement) compared to the nonadditive based devices. Overall, the additive enhanced grain growth process helped to reach a high 14.2% solar cell device efficiency with low hysteresis. This method of grain growth is quite general and provides a facile way to fabricate large-grained $CH_3NH_3PbI_3$ on any arbitrary surface by an all solution-processed route.

Some embodiments of the invention use a sequential two-step, solution based spin-coating technique as a representative deposition method to demonstrate the effect of an additive introduction, such as sodium ions, on properties of the perovskite film and the corresponding photovoltaic devices. Perovskite films were deposited on top of the PEDOT:PSS coated ITO/glass substrate via two-step deposition of two precursor solutions; a concentrated $PbI_2$ solution in dimethylformamide (DMF) followed by a dilute $CH_3NH_3I$ solution in 2-propanol. An intermediate annealing step (at 80° C. for 10 minutes) before $CH_3NH_3I$ deposition assists in partially evaporating the solvent and crystallize $PbI_2$, while the final heat treatment (at 100° C. for 80 minutes) of the deposited film drives the conversion of $PbI_2$ to $CH_3NH_3PbI_3$ by interdiffusion of the precursors, and facilitates crystallization and grain growth (referred to as pure thermal annealing). The diffusion enhanced grain growth, where precursor ions can penetrate through a longer distance than in a dry, all-solid state thermal annealing environment, is achieved by annealing the stacked film with DMF vapor for the same duration of time at the same temperature as done in the pure thermal annealing method (referred to as solvent annealing). A sodium iodide (NaI) solution in DMF was used as a controlled source of sodium and was added in different amounts (from 1 mol % to 8 mol % in 2 mol % increments) to the $PbI_2$ precursor solution.

Figure 1:
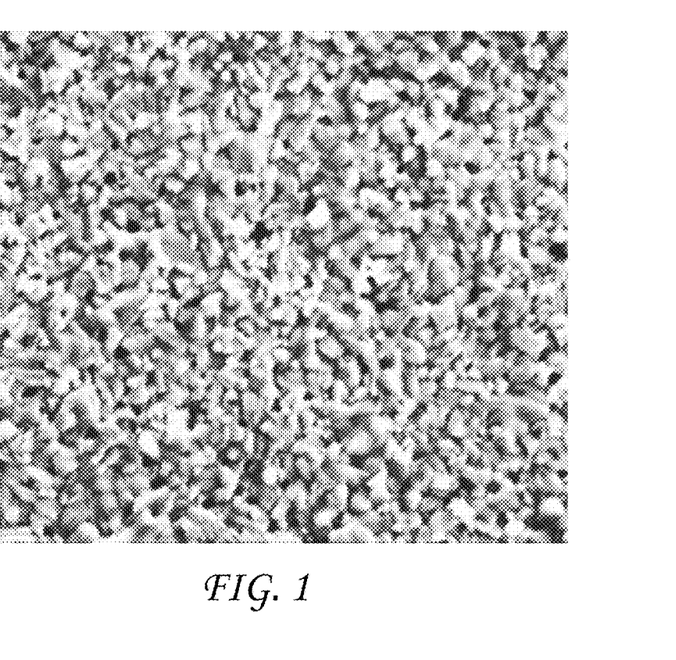
FIG. 1 is a top down scanning electron microscope (SEM) image of a 300 nm CH$_3$NH$_3$PbI$_3$ perovskite film grown on glass/ITO/PEDOT:PSS by thermal annealing.
Figure 2:
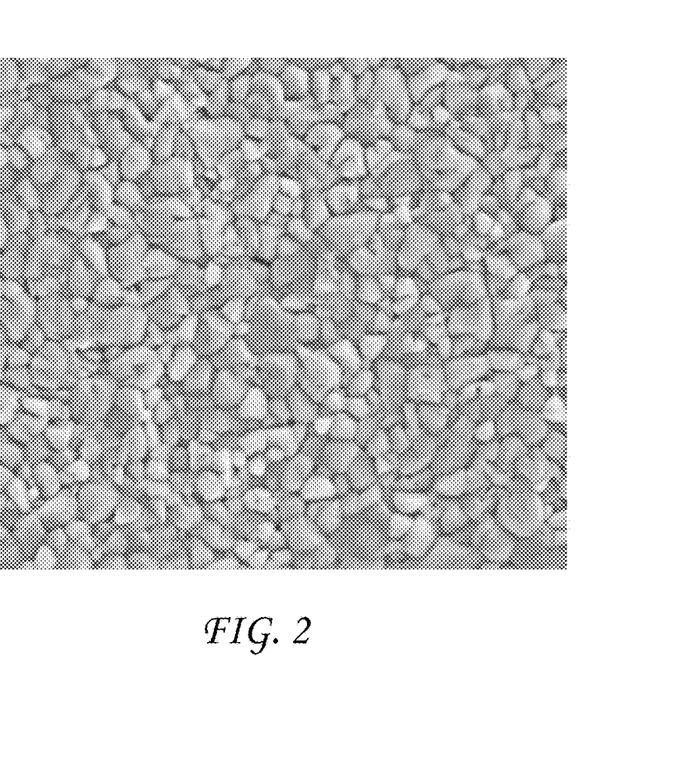
FIG. 2 is a top down SEM image of a 300 nm CH$_3$NH$_3$PbI$_3$ perovskite film grown on glass/ITO/PEDOT:PSS by solvent annealing.
Figure 3:
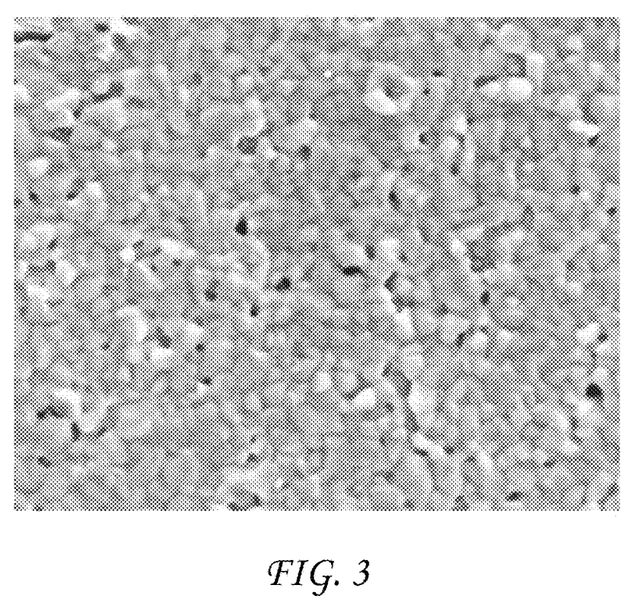
FIG. 3 is a top down SEM image of a 300 nm CH$_3$NH$_3$PbI$_3$ perovskite film grown on glass/ITO/PEDOT:PSS by thermal annealing with 2 mol % of NaI additive.
Figure 4:
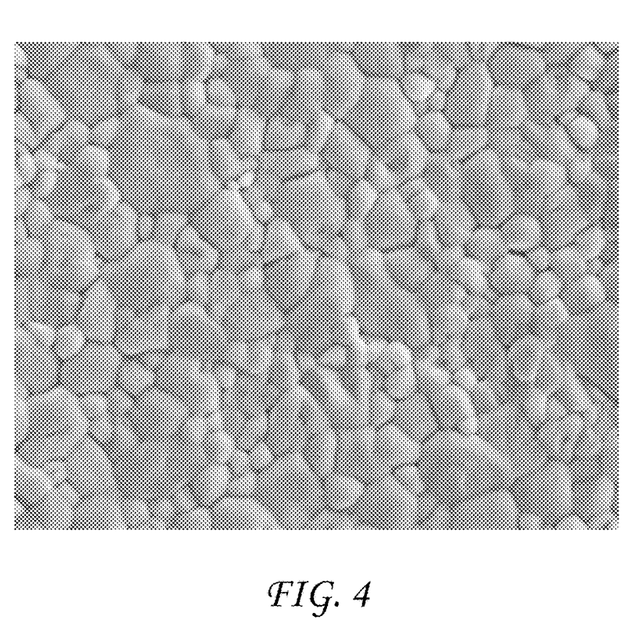
FIG. 4 is a top down SEM image of a 300 nm CH$_3$NH$_3$PbI$_3$ perovskite film grown on glass/ITO/PEDOT:PSS by solvent annealing with 2 mol % of NaI additive.

FIGS. 1-5 show scanning electron microscopy (SEM) images of the approximately 300 nm thick perovskite films, with and without added sodium, deposited on glass/ITO/PEDOT:PSS by a two-step solution deposition process and annealed under different environments including both with and without solvent vapor. In order to achieve consistency of results, these thin perovskite films were prepared identically other than the annealing conditions and additive incorporation. Pinhole free perovskite films with complete surface coverage were obtained by fine tuning the process conditions. Consistent with previous reports, without an additive the average grain size of the solvent annealed perovskite films is slightly larger than that of pure thermal annealed films as seen in FIGS. 1 and 2. However, when films are grown with controlled amount of an additive, such as sodium, in the precursor solution, the average grain size of the solvent annealed perovskite films increases substantially as seen in FIGS. 3 and 4. Some grains of micrometer size range are clearly observed in those sodium added and solvent annealed films, FIG. 4. Similar results were found for both NaI and NaBr as an additive (FIGS. 4 and 5), which suggests irrespective of the counter anions, sodium ions promote large grain growth under a diffusion facilitated, solvent annealing environment.

Figure 5:
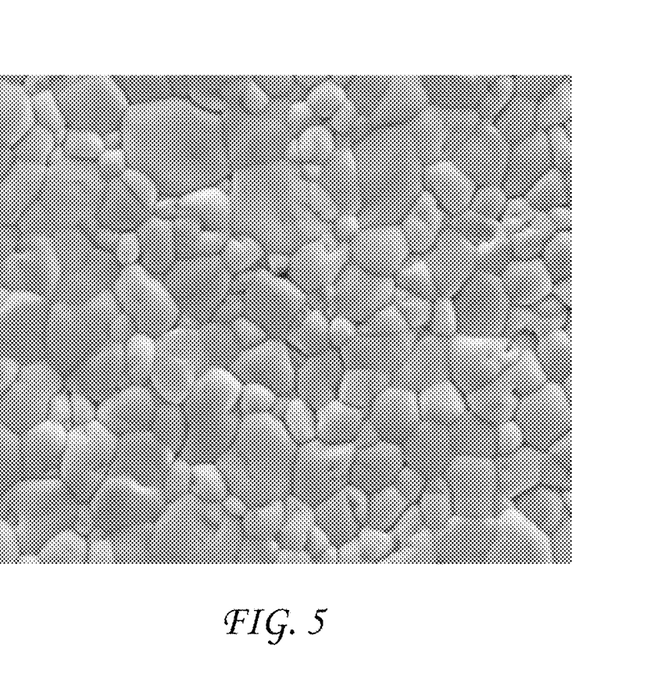
FIG. 5 is a top down SEM image of a 300 nm CH$_3$NH$_3$PbI$_3$ perovskite film grown on glass/ITO/PEDOT:PSS by solvent annealing with 2 mol % of NaBr additive.
Figure 6:
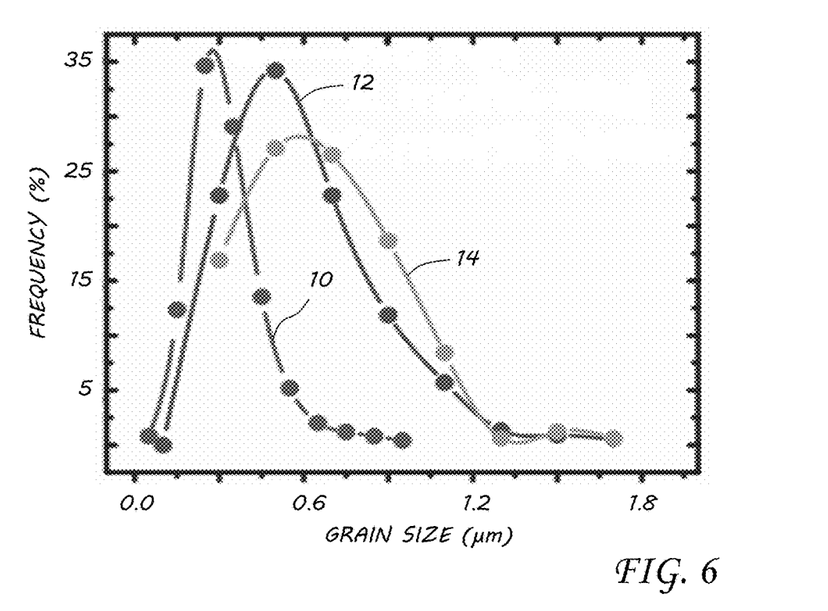
FIG. 6 is a graph depicting grain size distributions of the solvent annealed films of FIGS. 2, 4, and 5.
Figure 7:
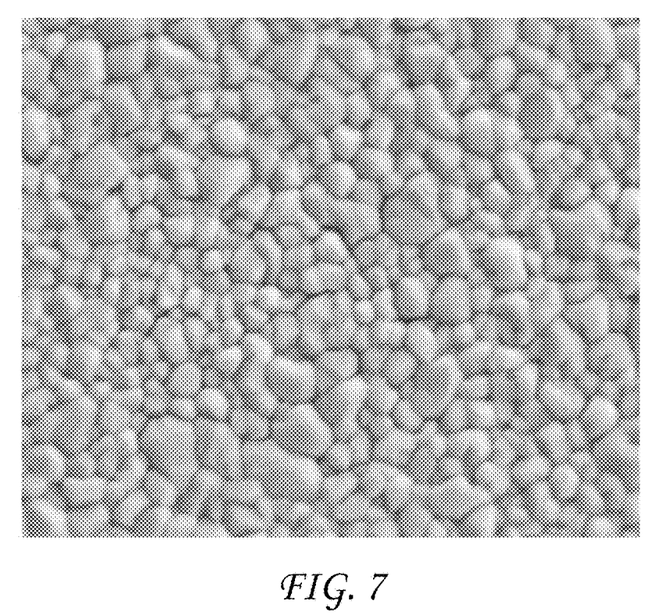
FIG. 7 is a top down SEM image of a perovskite film grown on glass/ITO/PEDOT:PSS under solvent annealing conditions of 100° C. for 80 minutes with 1 mol % Na additive.
Figure 8:
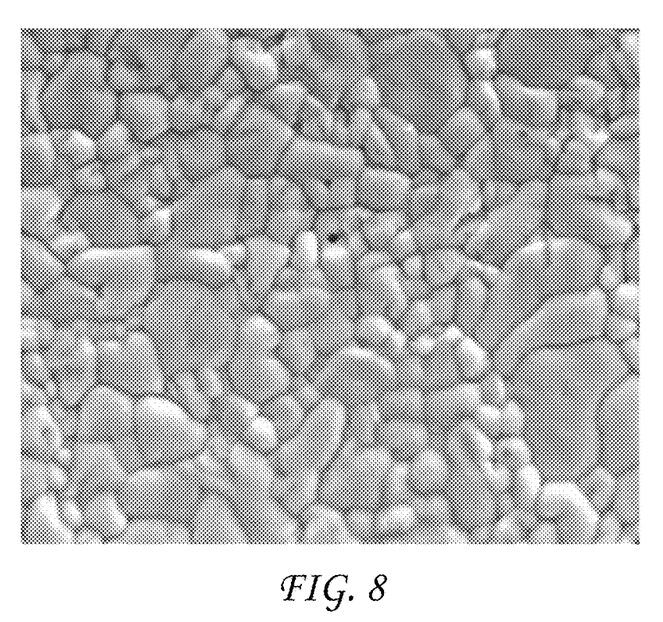
FIG. 8 is a top down SEM image of a perovskite film grown on glass/ITO/PEDOT:PSS under solvent annealing conditions of 100° C. for 80 minutes with 3 mol % Na additive.
Figure 9:
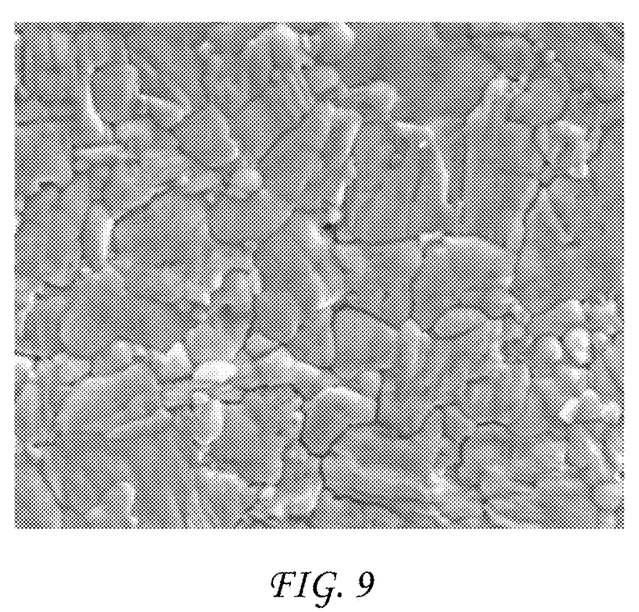
FIG. 9 is a top down SEM image of a perovskite film grown on glass/ITO/PEDOT:PSS under solvent annealing conditions of 100° C. for 80 minutes with 5 mol % Na additive.
Figure 10:
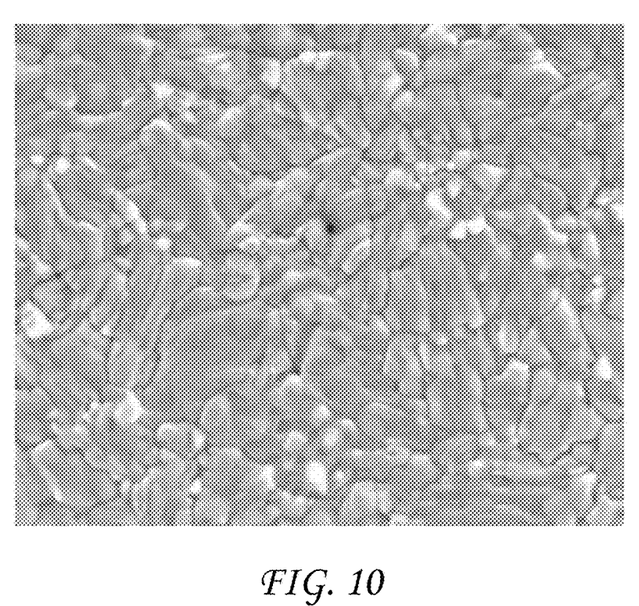
FIG. 10 is a top down SEM image of a perovskite film grown on glass/ITO/PEDOT:PSS under solvent annealing conditions of 100° C. for 80 minutes with 6 mol % Na additive.

The grain size distributions of the solvent annealed perovskite films, both without and with sodium, are calculated from FIGS. 2, 4, and 5, respectively using ImageJ software available at https://imagej.nih.gov/ij/ and are plotted in FIG. 6. The solvent annealed perovskite film without added sodium 10 had a narrow grain size distribution with a sharp peak at 270 nm, while the peak became broader and shifted to 520-585 nm after the addition of 2 mol % of sodium either as NaI 12 or NaBr 14. Also, the largest grain size increased from 950 nm to 1.7 micrometers after sodium addition. In some embodiments, in order to observe such a favorable effect of sodium additive on the perovskite grain growth, a diffusion facilitated support medium and annealing environments may be desirable. A compact $PbI_2$ layer in a two-step deposition process tends to hinder diffusion of ions and impede large grain formation even after sodium addition and solvent annealing.

Figure 11:
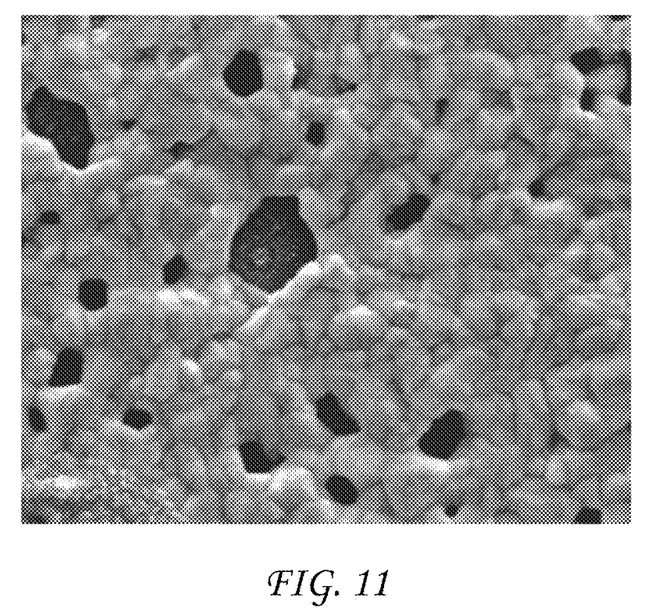
FIG. 11 is a top down SEM image of a perovskite film of FIG. 10 with 6 mol % Na additive from a different area of substrate.
Figure 12:
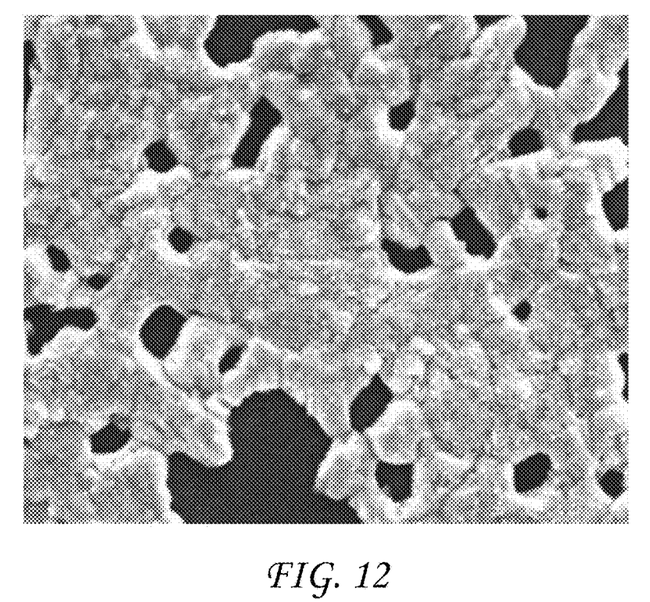
FIG. 12 is the top down SEM image of a perovskite film grown on glass/ITO/PEDOT:PSS under solvent annealing conditions of 100° C. for 80 minutes with 8 mol % Na additive.
Figure 13:
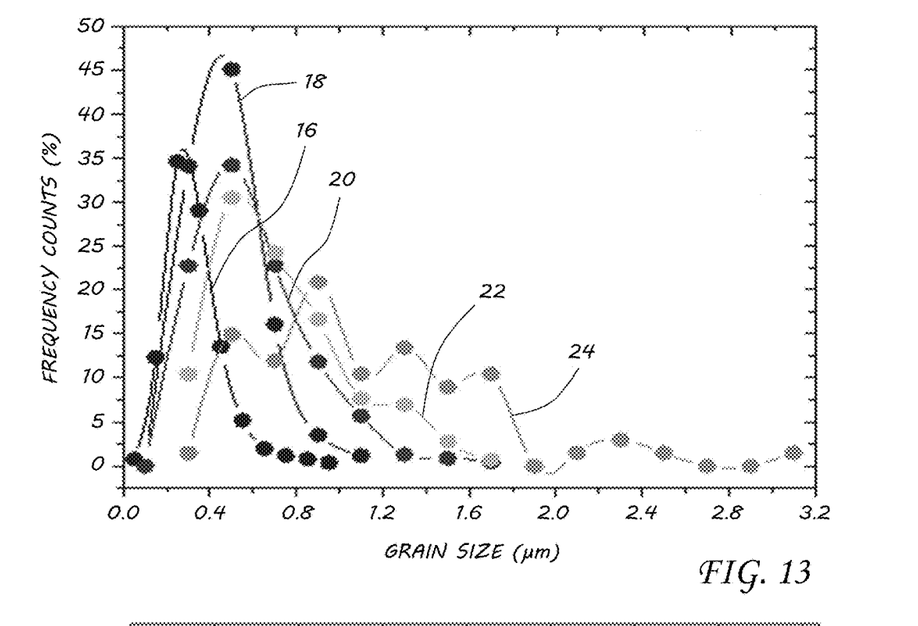
FIG. 13 is a graph of grain size distributions of different amounts of additive added to perovskite films on glass/ITO/PEDOT:PSS grown under the same solvent annealing conditions at 100° C. for 80 min with DMF vapor.
Figure 14:
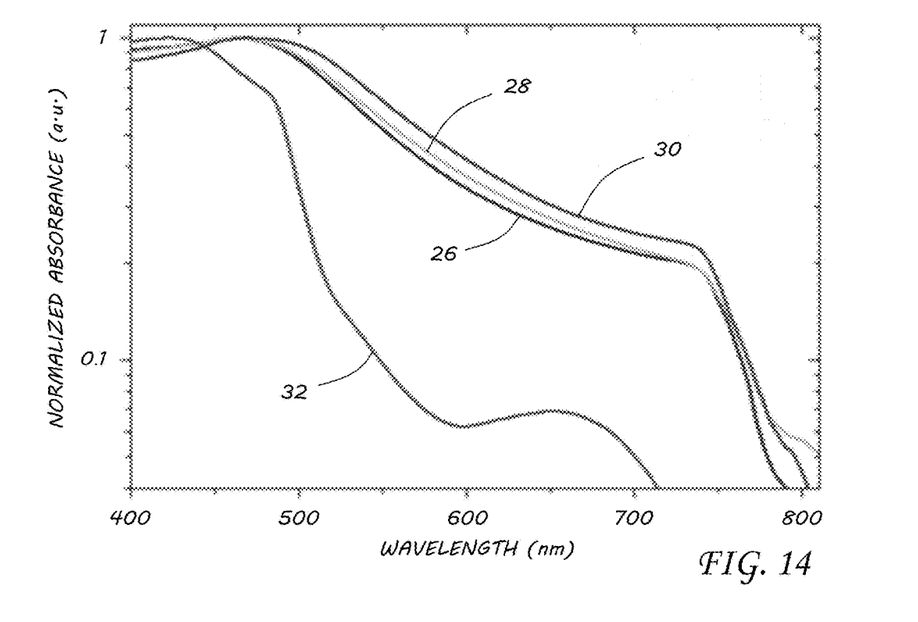
FIG. 14 is a graph of UV-vis absorption spectra of different solvent annealed perovskite films.

The effect that concentration of Na ions has on thin film morphology is shown in the SEM images of FIGS. 7-12. The approximately 300 nm thick perovskite films were prepared with different amounts of added Na but were annealed under the same solvent annealing conditions as set out above. The increase in average grain size of the perovskite film was significantly noticeable when the amount of added sodium in the precursor solution was greater than about 1 mol % and becomes saturated at an amount of about 5 mol %. At higher concentrations, a discontinuous perovskite film forms with many uncovered areas of the substrate. The discontinuous nature starts on some areas of the substrate at about 6 mol % as seen in FIG. 11 and on the entire substrate at about 8 mol %. FIG. 13 shows the average grain size of the films with no additive 16, 1 mol % additive 18, 2 mol % additive 20, 3 mol % additive 22, and 5 mol % additive 24. While the average grain size of the film with about 5 mol % sodium is the largest for the processing conditions, the film is comprised of rougher grains with irregular shapes. More ordered, large, flat, and polygonal grains with triple junction grain boundaries were obtained at about 2 mol % of sodium FIGS. 4 and 5. The normalized UV-Visible near infrared absorption spectra of the perovskite film shows no dramatic change of the band-edge absorption around 750-800 nm with this low level of Na doping. FIG. 13 shows absorptions for no additive 26, 1 mol % additive 28, 2 mol % additive 30, and $PbI_2$ 32.

Figure 15:
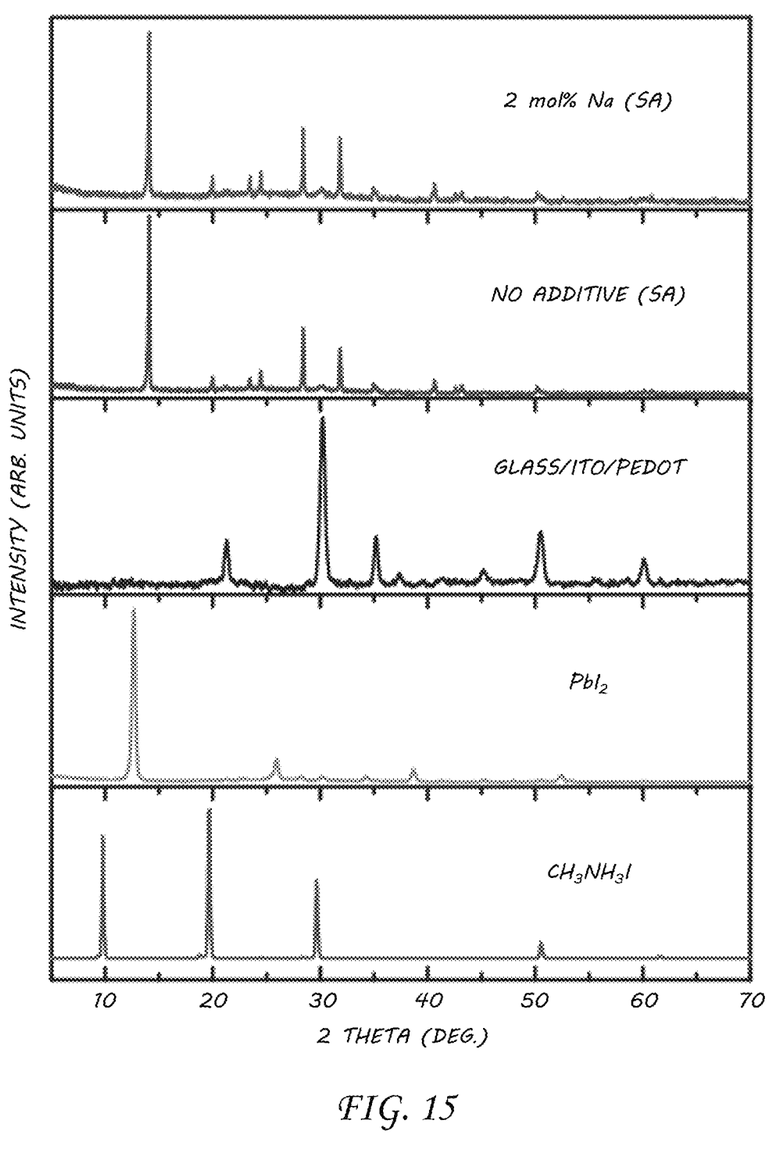
FIG. 15 is a graph showing a comparison of X-ray diffraction patterns of solvent annealed perovskite films on glass/ITO/PEDOT:PSS with and without Na additive.
Figure 16:
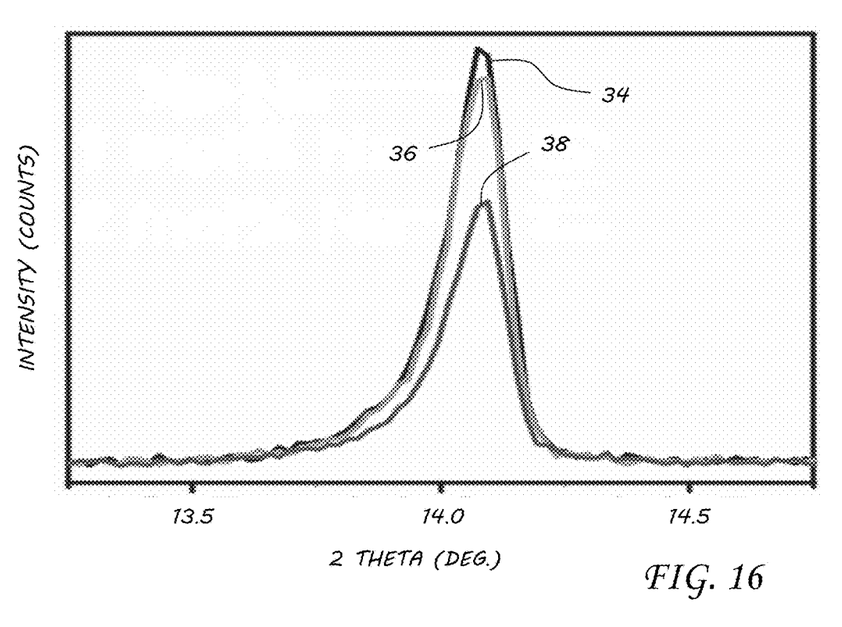
FIG. 16 is a graph showing the most intense diffraction peak in FIG. 15 compared among different additive amounts.
Figure 17:
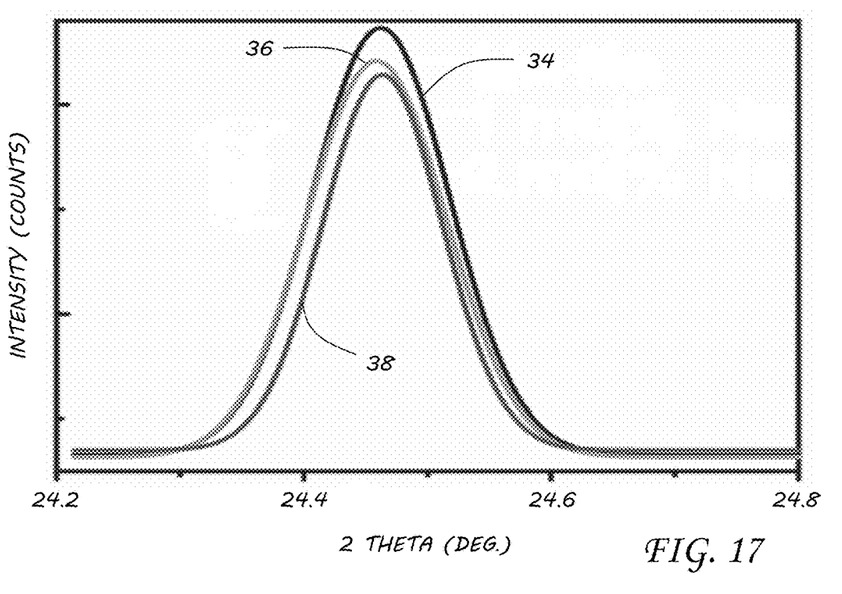
FIG. 17 is a graph showing the reflection peak in FIG. 15 compared among different additive amounts.

To gain further insight into the formation and crystallization of perovskite phases using low concentrations of sodium additives, X-ray diffraction (XRD) data were collected on thin-film samples for no additive 34, 1 mol % additive 36, and 2 mol % additive 38. The XRD patterns in FIGS. 15-17 show that the perovskite films grown with added sodium (up to 2 mol %) form a tetragonal phase with no systematic shifting in the peak positions, and do not contain any $PbI_2$ or $CH_3NH_3I$ impurity peaks. Under identical processing conditions, the full width at half maximum (FWHM) value of the most intense diffraction peak (FIG. 16) of the pristine perovskite film at 14.08° remains significantly unchanged after sodium addition. On the other hand, analysis of FWHM for the reflection (FIG. 17) at 24.48° shows slightly narrower peaks with increasing amount of added Na, which is in agreement with the increased grain size.

Figure 18:
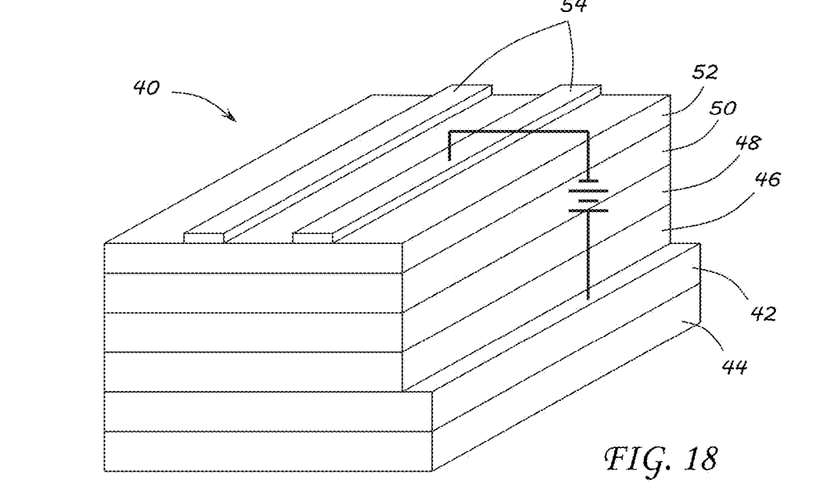
FIG. 18 is a schematic representation of an exemplary CH$_3$NH$_3$PbI$_3$ photovoltaic device structure.

The impact of using an additive for the perovskite film growth on solar cell device performance was explored by fabricating two sets of photovoltaic cells. An exemplary cell 40 is illustrated in FIG. 18. All thin-film perovskite solar cell devices were fabricated on patterned indium-doped tin oxide (ITO) 42 glass 44 (Sheet resistance of 15Ω/□) substrates. On the day of deposition, the ITO glass substrates 42,44 were cleaned sequentially by sonicating with detergent, deionized water, acetone, and iso-propanol, followed by drying with high flow of nitrogen and UV-ozone treatment for 20 min. Filtered (0.45 micron PVDF filter) poly-(3,4-ethylenedioxythiophene:poly (styrenesulfonic acid) (PEDOT:PSS; Clevios P from Heraeus Materials Technology) 46 was spin coated onto the clean ITO glass substrates 42,44 at 3000 rpm for 60 s and then dried on a ceramic hot-plate at 160° C. for 15 min in ambient atmosphere. Thereafter, the PEDOT:PSS 46 coated ITO glass substrates 42,44 were immediately taken into a nitrogen filled glove box where $CH_3NH_3PbI_3$ active layer 48 was fabricated by a two-step sequential deposition method discussed above. Particularly, hot $PbI_2$ (dissolved in anhydrous dimethylformamide at 75° C., 400 mg/ml concentration) solution was spun on the top of the PEDOT:PSS 46/ITO substrate 42,44 at a spin rate of 6000 rpm for 35 s and the resulting $PbI_2$ layer was dried in a closed container for 15 min at room temperature followed by a mild annealing at 80° C. for 10 min on a hot plate. Then $CH_3NH_3I$ solution (dissolved in anhydrous 2-propanol, 45 mg/ml concentration) was dripped on top of the dried $PbI_2$ layer during spinning at 6000 rpm for 35 s. Finally, the stacked precursor layers of $PbI_2$ and $CH_3NH_3I$ were annealed on a hot plate at 100° C. for 80 min. To apply solvent annealing, the films were heated on a hot plate at 100° C. with a drop of DMF covered with a glass lid for the same duration of time forming the final perovskite layer 48. For the additive enhanced perovskite grain growth process, different amounts of NaI or NaBr (dissolved in DMF at 80° C. for 30 min, 1 molar concentration) were added to the $PbI_2$ solution and thin-films were fabricated using the same methodology. After the annealing step, a thin layer of $PC_{71}BM$ (20 mg/ml in dichlorobenzene) 50 was deposited on the top of the $CH_3NH_3PbI_3$ layer 48 by spin-coating at 6000 rpm for 40 s. Ultimately, the device was finished by thermal evaporation of $C_{60}$ (30 nm) 52 and Al (150 nm) 54. The active area of each device is 0.1 $cm^2$, measured by the overlap of top Al electrode and ITO.

Figure 19:
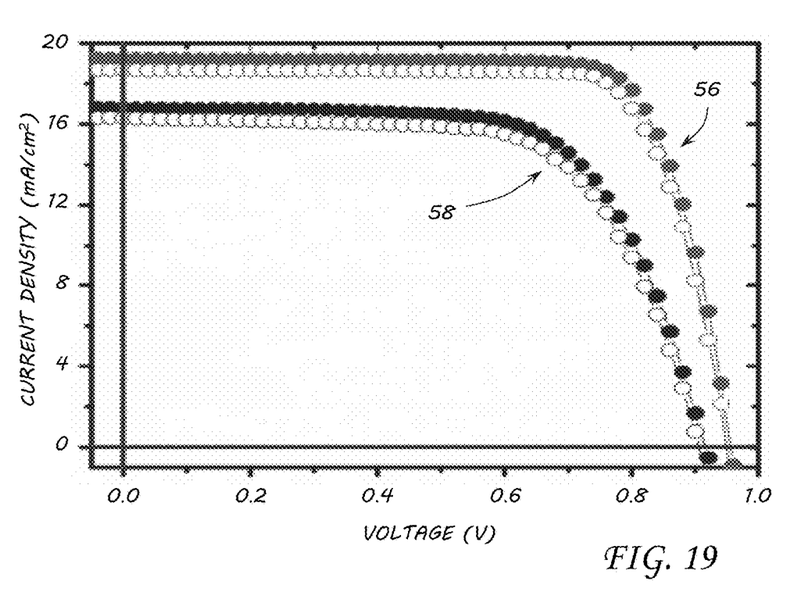
FIG. 19 is a graph a current density v. voltage curve showing the differences between structures having perovskite films deposited with and without an additive.
Figure 20:
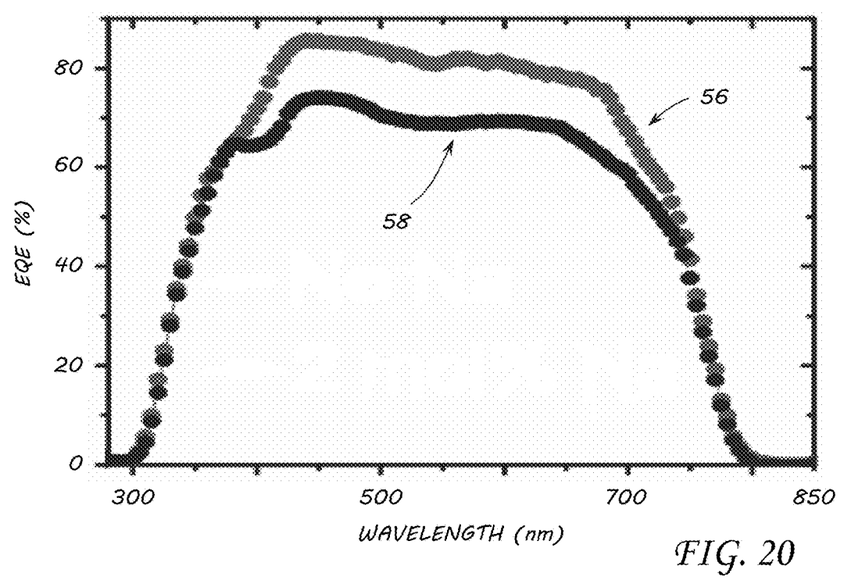
FIG. 20 is a graph of external quantum efficiency showing the differences between structures having perovskite films deposited with and without an additive.
Figure 21:
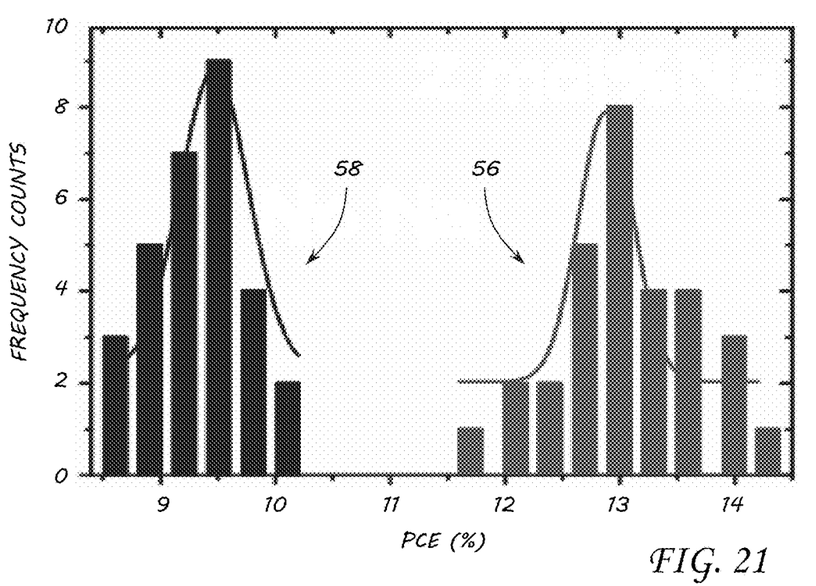
FIG. 21 is a graph of efficiency statistics showing the differences between structures having perovskite films deposited with and without an additive.

The devices for which additive was used 56 exhibit superior performance characteristics in all respects compared to the control samples 58 as shown in FIGS. 19-21 for the best performing cells measured under light intensities of 100 mW/cm2. The current-voltage (J-V) curves do not show significant hysteresis (FIG. 19). The overall power conversion efficiency improved from 10.2% to 14.2% when the additive was used during perovskite film growth. This improvement results from enhancements in each of the device performance parameters including the fill factor (FF), open circuit voltage ($V_{OC}$) and short-circuit current density ($J_{SC}$). Consistent with this, photovoltaic devices based on the film grown with the additive show higher external quantum efficiency (EQE) in the entire visible (350-750 nm) spectral region compared to control samples without the additive, FIG. 20. These effects may be attributed to a reduction in charge recombination due to the larger grain size and consequent smaller grain boundary area. These results were highly consistent for many different devices as is demonstrated by comparing the results of more than 25 different cells, as shown in FIG. 21. On average, a 2-3% increase in absolute power conversion efficiency is observed when an additive is used to induce larger grain sizes in perovskite films for photovoltaic cells.

The formation of pinhole-free, large-grained perovskite films on top of the PEDOT:PSS surface by incorporating very small amounts of a sodium additive during the crystallization process enables the fabrication of planar heterojunction solar cells with power conversion efficiencies as high as 14.2%. Even greater efficiency enhancement may be expected through further process optimization and integration of this approach to some of the state-of-the-art device fabrication protocols. The approach illustrated in the embodiments of the invention is expected to provide an effective strategy to fabricate high quality perovskite films even by high-throughput solution-based deposition techniques like inkjet-printing, slot-die coating, or aerosol-jet printing etc. The applicability of the methodology of the embodiments of the invention may be extended to other perovskite device architectures comprising different interlayers, and material systems where the fabrication of large grains is an issue. This methodology could further impact the fabrication of lightweight perovskite based hybrid optoelectronic devices, such as field effect transistors, photodetectors, and light emitting diodes on rigid as well as flexible, stretchable polymer substrates.

One of ordinary skill in the art would readily realize the possible substitutions in materials, device architectures, fabrication tools, and processing steps that may be made without significantly detracting from the invention. For example, the present method of metal-ion additives for growing large grain size crystallites may be applied to any materials in the broad family of organic-inorganic hybrid perovskites having the formula $ABX_3$, or $A2A'y-1ByX3y+1$, where A and A' are organic monovalent cations that are independently selected from R1NH3+, R1R2NH2+, R1R2R3NH+, R1R2R3R4N+, R1NH2+, R1R2NH+, R1R2R3N+, R1R2N+(any one of R1, R2 and R3 being independently selected from C1-C15 organic substituents comprising from 0 to 15 heteroatoms), or a mixture of any two or more thereof; B may be selected from Pb, Sn, Ge, Si or a mixture of any two or more thereof; X may be selected from Cl, Br, I, SCN, CN or a mixture of any two or more thereof; and y=1, 2 to infinity. The metal ion additive may be expanded beyond sodium, which was used in the illustrated embodiments above, and may be selected from Li+, K+, Na+, Rb+, Cs+, Ag+, Be2+, Mg2+, Ca2+, Sr2+, Ba2+, Zn2+, Cd2+, Hg2+, Fe2+/Fe3+, Ru2+/Ru3+, Os4+, Mn2+, Pt2+, Pd2+, Sb3+, Ga3+, In3+, Al3+, Bi3+, La3+, Ce3+, Pr3+, Nd3+, Pm3+, Sm3+, Eu3+, Gd3+, Tb3+, Dy3+, Ho3+, Er3+, Tm3+, Yb3+, Lu3+, Sn4+, Ti4+, Ge4+, Zr4+, V4+, Nb5+, Ta5+, Zr4+, Hf4+, Sc3+, Y2+/Y3+, Tc4+/Tc7+, Cr3+/Cr2+/Cr6+, Mo4+/Mo6+, W4+/W6+, Co2+/Co3+, Rh3+, Ir3+/Ir2+/Ir4+, Ni2+, Cu1+/Cu2+, Au1+/Au3+, and combinations thereof. Oxidation state of a given metal ion additive may vary from 0 to 6. Optimum concentration range of an additive may vary between 1-100 mol % depending on the additive. Alternative fabrication methods like one-step or multi-step layer-by-layer solution or vapor based deposition of precursors may also be used instead of the method depicted in the illustrated embodiment. The technique of additive introduction in the precursors or in the film may be altered by changing substrates, interlayers, and growth environments.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of forming perovskite thin films with micron-sized perovskite grains, the method comprising:
    applying a layer of $PbX_2$ in a solution containing a metal ion additive to a structure;
    annealing the structure with the $PbX_2$ layer a first time;
    exposing the $PbX_2$ to $CH_3NH_3X$ in a solvent; and
    annealing the structure with the exposed $PbX_2$ layer a second time resulting in a $CH_3NH_3PbX_3$ layer,
    wherein X is selected from a group consisting of Cl, Br, I, CN, and SCN.

2. The method of claim 1, wherein the metal ion additive is selected from a group consisting of: Li+, K+, Na+, Rb+, Cs+, Ag+, Be2+, Mg2+, Ca2+, Sr2+, Ba2+, Zn2+, Cd2+, Hg2+, Fe2+/Fe3+, Ru2+/Ru3+, Os4+, Mn2+, Pt2+, Pd2+, Sb3+, Ga3+, In3+, Al3+, Bi3+, La3+, Ce3+, Pr3+, Nd3+, Pm3+, Sm3+, Eu3+, Gd3+, Tb3+, Dy3+, Ho3+, Er3+, Tm3+, Yb3+, Lu3+, Sn4+, Ti4+, Ge4+, Zr4+, V4+, Nb5+, Ta5+, Zr4+, Hf4+, Sc3+, Y2+/Y3+, Tc4+/Tc7+, Cr3+/Cr2+/Cr6+, Mo4+/Mo6+, W4+/W6+, Co2+/Co3+, Rh3+, Ir3+/Ir2+/Ir4+, Ni2+, Cu1+/Cu2+, Au1+/Au3+, and combinations thereof.

3. The method of claim 2, wherein an oxidation state of the metal ion additive ranges from 0 to 6.

4. The method of claim 2, wherein the metal ion additive is Na+.

5. The method of claim 1, wherein a concentration of the metal ion additive is between about 1 mol % and about 6 mol %.

6. The method of claim 5, wherein the concentration of the metal ion additive is about 2 mol %.

7. The method of claim 1, wherein the solvent is anhydrous 2-propanol.

8. The method of claim 1, wherein the first annealing is at 80° C. for 10 minutes.

9. The method of claim 1, wherein the second annealing is at 100° C. for 80 minutes.

10. A method for making a layered perovskite structure, the method comprising:
    applying a PEDOT:PSS coating to an ITO glass substrate;
    drying the PEDOT:PSS coated surface;
    applying a layer of $PbX_2$ in a solution containing a metal ion additive to the PEDOT:PSS coating;
    annealing the PEDOT:PSS coated ITO glass substrate with the $PbX_2$ layer a first time;
    exposing the $PbX_2$ to $CH_3NH_3X$ in a solvent; and
    annealing the PEDOT:PSS coated ITO glass substrate with the exposed $PbX_2$ layer a second time resulting in a $CH_3NH_3PbX_3$ layer,
    wherein X is selected from a group consisting of Cl, Br, I, CN, and SCN.

11. The method of claim 10, wherein the metal ion additive is selected from a group consisting of: Li+, K+, Na+, Rb+, Cs+, Ag+, Be2+, Mg2+, Ca2+, Sr2+, Ba2+, Zn2+, Cd2+, Hg2+, Fe2+/Fe3+, Ru2+/Ru3+, Os4+, Mn2+, Pt2+, Pd2+, Sb3+, Ga3+, In3+, Al3+, Bi3+, La3+, Ce3+, Pr3+, Nd3+, Pm3+, Sm3+, Eu3+, Gd3+, Tb3+, Dy3+, Ho3+, Er3+, Tm3+, Yb3+, Lu3+, Sn4+, Ti4+, Ge4+, Zr4+, V4+, Nb5+, Ta5+, Zr4+, Hf4+, Sc3+, Y2+/Y3+, Tc4+/Tc7+, Cr3+/Cr2+/Cr6+, Mo4+/Mo6+, W4+/W6+, Co2+/Co3+, Rh3+, Ir3+/Ir2+/Ir4+, Ni2+, Cu1+/Cu2+, Au1+/Au3+, and combinations thereof.

12. The method of claim 11, where an oxidation state of the metal ion additive ranges 0 to 6.

13. The method of claim 10, wherein a concentration of the metal ion additive is between about 1 mol % and about 6 mol %.

14. The method of claim 10, wherein the PEDOT:PSS is spin-coated onto the ITO glass substrate.

15. The method of claim 14, wherein the PEDOT:PSS is spin-coated onto the ITO glass substrate at 300 rpm for 60 seconds and dried at 140° C. for 20 minutes in an ambient atmosphere.

16. The method claim 10, wherein the layer of $PbX_2$ is spun on the top of the PEDOT:PSS coating in a solvent.

17. The method of claim 16, wherein the solvent is dimethyl formamide (DMF).

18. The method claim 10, wherein the $CH_3NH_3X$ is dripped onto the $PbX_2$ layer while spinning at 6000 rpm for 35 seconds.

19. The method of claim 10, wherein the solvent is anhydrous 2-propanol.

20. The method of claim 10, wherein the first annealing is at 80° C. for 10 minutes.

21. The method of claim 10, wherein the second annealing is at 100° C. for 80 minutes.

22. The method of claim 10, wherein the second annealing is performed with a drop of DMF on the $CH_3NH_3X$ and $PbX_2$ layers.

23. The method of claim 10, further comprising:
- depositing a layer of $PC_{71}BM$ atop the resulting $CH_3NH_3Pb_3$ layer; and
- performing thermal evaporation of $C_{60}$ and Al onto the $PC_{71}BM$ layer.

* * * * *